United States Patent
Liu et al.

(10) Patent No.: US 10,050,082 B1
(45) Date of Patent: Aug. 14, 2018

(54) HALL ELEMENT FOR 3-D SENSING USING INTEGRATED PLANAR AND VERTICAL ELEMENTS AND METHOD FOR PRODUCING THE SAME

(71) Applicant: GLOBALFOUNDRIES Singapore Pte. Ltd., Singapore (SG)

(72) Inventors: Bin Liu, Singapore (SG); Ruchil Kumar Jain, Singapore (SG); Eng Huat Toh, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/678,740

(22) Filed: Aug. 16, 2017

(51) Int. Cl.
| | |
|---|---|
| H01L 27/22 | (2006.01) |
| H01L 43/06 | (2006.01) |
| H01L 43/04 | (2006.01) |
| H01L 43/14 | (2006.01) |
| G01R 33/07 | (2006.01) |
| H01L 21/762 | (2006.01) |

(52) U.S. Cl.
CPC ............ *H01L 27/22* (2013.01); *G01R 33/072* (2013.01); *H01L 21/762* (2013.01); *H01L 43/04* (2013.01); *H01L 43/065* (2013.01); *H01L 43/14* (2013.01)

(58) Field of Classification Search
CPC ....... H01L 21/70; H01L 21/702; H01L 21/71; H01L 21/8232; H01L 43/00
See application file for complete search history.

(56) References Cited

U.S. PATENT DOCUMENTS

| | | | |
|---|---|---|---|
| 7,511,484 B2 | 3/2009 | Oohira et al. | |
| 9,349,943 B2 | 5/2016 | Röhrer | |
| 9,525,077 B1* | 12/2016 | Bi | ..... H01L 21/76224 |
| 2014/0175528 A1* | 6/2014 | Zieren | ........ G01R 33/066 |
| | | | 257/295 |

OTHER PUBLICATIONS

Schott et al., "Integrated 3-D Hall Magnetic Field Sensor", retrieved on Jul. 28, 2017 from "http://www.gmw.com/magnetic_sensors/sentron/2sa/pdf/3D-H-introduction.pdf", Lausanne, Switzerland, 4 pages.
Dimitrov, "3-D Hall Sensor for use in Navigation Systems for Surgery Endovascular Interventions", published in Intelligent Data Acquisition and Advanced Computing Systems: Technology and Applications, 2007. IDAACS 2007. 4th IEEE, retrieved on Jul. 28, 2017, from "http://ieeexplore.ieee.org/document/4488499/", pp. 639-642.
Pascal et al., "3D Hall probe integrated in 035 μm CMOS technology for magnetic field pulses measurements", published in Circuits and Systems and TAISA Conference, 2008. NEWCAS-TAISA 2008. 2008 Joint 6th International IEEE Northeast, retrieved on Jul. 28, 2017 from "http://ieeexplore.ieee.org/document/4606330/", pp. 97-100.

* cited by examiner

*Primary Examiner* — Cheung Lee
(74) *Attorney, Agent, or Firm* — Ditthavong & Steiner, P.C.

(57) ABSTRACT

A method of forming a 3D Hall effect sensor and the resulting device are provided. Embodiments include forming a shallow trench isolation (STI) region and a deep trench isolation (DTI) region in a substrate; forming a p-type well in the substrate surrounded by the STI region in top view; forming a first n-type well and a second n-type well surrounded by the p-type well and DTI region in top view; forming n-type dopant in the first n-type well and the second n-type well; and forming p-type dopant in the p-type well.

20 Claims, 12 Drawing Sheets

HALL ELEMENT FOR 3-D SENSING USING INTEGRATED PLANAR AND VERTICAL ELEMENTS AND METHOD FOR PRODUCING THE SAME

TECHNICAL FIELD

The present disclosure relates to semiconductor fabrication. In particular, the present disclosure relates to Hall elements integrated into semiconductor devices in advanced technology nodes.

BACKGROUND

A Hall effect is the production of a voltage difference (the Hall voltage) across an electrical conductor, transverse to an electric current in the conductor, and a magnetic field perpendicular to the current. When a current-carrying semiconductor is kept in a magnetic field, the charge carriers of the semiconductor experience a force in a direction perpendicular to both the magnetic field and the current. At equilibrium, a voltage appears at the semiconductor edges. The formula for the Hall coefficient becomes more complex in semiconductors where the carriers are generally both electrons and holes which may be present in different concentrations and have different mobilities.

Hall effect sensors are used as proximity sensors, slide-by switch sensors, wheel speed sensors, and brushless DC motor sensors in a variety of industries. Hall sensors are used in the household appliances, gaming systems, construction equipment, utility meters and in the automotive industry as magnetic sensors for position measurements. Traditional mechanical based switches tend to wear out over many "close"/"open" operations, having long-term reliability issues. Hall effect sensors offer excellent long-term reliability since they can operate without the need to have any contacting mechanical parts and are beneficial for automotive applications which have stringent reliability requirements.

One-dimensional (1D) Hall effect sensors sense a magnetic field perpendicular to a semiconductor chip. Three-dimensional (3D) sensors are advantageous over 1D sensors, since fewer 3D sensors can be used, thereby saving space, time and cost. 3D Hall effect sensors are an improvement over 1D sensors, since they sense a magnetic field both perpendicular and in-plane to the chip. 3-Axis Hall sensors are integrated 1D and two dimensional (2D) elements and assembled from six building blocks, thereby making the assembly process too complicated, and the resulting sensor undesirably large. Further, with 3-Axis sensors, the magnetic field may not be sensed in one common region. For a multiple contact Hall sensor, each sensing terminal is a result or under the influence of at least two magnetic fields, which leads to cross interference. Moreover, with existing 3D Hall sensors, the employment of one n-type element makes it more difficult to design planar and vertical Hall elements for sensitivity optimization.

A need therefore exists for devices and methodologies for enabling vertical and planar elements to be integrated within a 3D Hall effect sensor to improve sensing accuracy and to reduce cost and cross-interference within the resulting devices.

SUMMARY

An aspect of the present disclosure is a Hall element for 3D sensing with integrated planar and vertical elements. Another aspect of the present disclosure is a Hall element wherein the integrated plane and vertical elements operate at different phases of a clock cycle for sensing with reduced cross-interference. Another aspect of the present disclosure is a Hall element with better design flexibility within a single element footprint and enabling methodology. Yet another aspect of the present disclosure is a Hall element for sensing in a single concentrated region with reduced interference with separate sensing for each magnetic field component. Still further, another aspect of the present disclosure includes individual optimization of vertical and planar Hall elements.

Further aspects include reducing doping or thickness of a vertical Hall element to significantly improve sensitivity, without affecting the planar Hall element. Another aspect of the present disclosure includes a Hall element with current tool and process capabilities, such as deep trench isolation (DTI), without any additional masks. Yet another aspect of the present disclosure includes a Hall element compatible with complementary metal oxide semiconductors (CMOS) in the 180 nanometer (nm) technology node and beyond, including BCD or BCD lite technology which incorporates analog components (Bipolar), digital components (CMOS) and high-voltage transistors (DMOS) on the same die.

A Hall element of the present disclosure achieves good sensitivity with no cross interference, without adding any additional mask or requiring significant space requirements. Individual optimization of planar and vertical Hall elements is achieved. Sensitivity can be boosted by circuit connection and structure optimizations instead of process tunings Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including forming a shallow trench isolation (STI) region and a DTI region in a substrate; forming a p-type well in the substrate surrounded by the STI region in top view; forming a first n-type well and a second n-type well surrounded by the p-type well and DTI region in top view; forming n-type dopant in the first n-type well and the second n-type well; and forming p-type dopant in the p-type well.

Aspects of the present disclosure include employing a p-type substrate. Other aspects include forming a substrate with a n-type substrate (n-sub) implant. Other aspects include forming a substrate with an n-epitaxial growth over a n-sub implant. Additional aspects include forming the first n-type well as a cross-shaped pattern in top view. Additional aspects include forming the second n-type well as a fragmented square-shaped pattern partially surrounding the cross-shaped pattern in top view. In an additional aspect, a fragment of the fragmented square-shaped pattern intersects an end-point of the cross-shaped pattern perpendicularly.

Further aspects include forming a cover layer over the first n-type well and the second n-type well. Yet other aspects include forming a cover layer including a p-type cover, STI region, or a layer of local oxidation of silicon (LOCOS) over the cover layer or directly on the first n-type well and the second n-type well. Additional aspects include forming p-type well to surround the second n-type well in top view. Other aspects include forming the STI region and DTI region prior to forming the p-type well, wherein the STI region, DTI region and p-type well provide isolation between a planar Hall element located in a first region of the n-epitaxial growth in top view, a vertical Hall element located in a second region of the n-epitaxial growth extending vertically in the device in cross section view or a combination thereof. Another aspect includes forming the p-type well prior to forming the first n-type well or the second n-type well while yet another aspect includes forming the p-type well after forming the first n-type well or the second n-type well.

Additional aspects include forming an interlayer dielectric (ILD) over the first n-type well, the second n-type well and the p-type well; performing self-aligned silicidation to reduce resistance in the first n-type well, the second n-type well and the p-type well; forming contacts in the ILD; and performing back-end-of-line (BEOL) processing.

Another aspect of the present disclosure is a device including a STI region and DTI region formed in a substrate; a p-type well formed in the substrate between the STI region in top view; a first n-type well and a second n-type well formed in the substrate and surrounded by the p-type well and DTI region in top view; n-type dopant implanted in the first n-type well and the second n-type well; and p-type dopant implanted in the p-type well, wherein the device is configured to sense a magnetic field perpendicular and in-plane direction relative to the device.

Aspects of the present disclosure include providing a p-type substrate and the substrate further includes a n-sub implant and an n-epitaxial growth formed over the n-sub implant. Other aspects include the first n-type well is formed as a cross-shaped pattern in top view and the second n-type well is formed as a fragmented square-shaped pattern partially surrounding the cross-shaped pattern in top view, wherein a fragment of the fragmented square-shaped pattern intersects an end-point of the cross-shaped pattern perpendicularly. Another aspect includes providing a cover layer formed over the first n-type well and the second n-type well, wherein the cover layer includes a p-type cover, STI region or a LOCOS.

Further aspects include providing a planar Hall element located in a first region of the n-epitaxial growth in top view; and a vertical Hall element located in a second region of the n-epitaxial growth extending vertically in the device in cross section view. Another aspect includes providing the p-type well to surround the second n-type well and wherein the STI region, DTI region and p-type well provide isolation between the planar Hall element and the vertical Hall element. In yet another aspect, the planar Hall element and the vertical Hall element are configured to operate at different clock cycles.

Additional aspects of the present disclosure providing an ILD over the first n-type well, the second n-type well and the p-type well; and contacts in the ILD, wherein the device is configured for multiple terminal sensing.

Additional aspects and technical effects of the present disclosure will become apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the problems of forming Hall elements that yield better design flexibility and footprint efficiency for 3D sensing. In accordance with embodiments of the present disclosure, a 3D Hall element provides magnetic field sensing in both perpendicular and in-plane directions relative to the semiconductor chip.

Still other aspects, features, and technical effects will be apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 1A through 4C schematically illustrate a process flow for forming a 3-D Hall element, in accordance with an exemplary embodiment. FIG. 1B is a cross-sectional view of FIG. 1A along line 1B-1B'. Cross-sectional views of FIGS. 1B, 2B, 3B and 4B illustrate the formation of the planar Hall element. Adverting to FIGS. 1A and 1B, a substrate 101 is provided. The substrate 101 can include a p-type substrate. The substrate 101 can optionally include a n-sub implant 103. The substrate 101 optionally includes an n-epitaxial growth 105 over the n-sub implant 103. Isolation structures, discussed further below, including STI regions 107 and DTI 109 regions are formed in the substrate 101. The STI regions 107 extend into the n-epitaxial growth 105. The DTI region 109 extends through the n-sub implant 103 and n-epitaxial growth 105. DTI region 109 provides isolation between the planar and vertical elements of the Hall device to reduce interference. No additional p-well isolation or tailored deep low doping n-well is needed for the vertical Hall element due to the presence of DTI region 109 surrounding the low doping n-epitaxial growth 105, which makes for a larger effective depth (i.e., larger sensing area) of the vertical Hall element. DTI region 109 provides isolation between Hall sensors and other devices to reduce interferences. High voltage operation of the circuits will not affect the functionalities of Hall devices due to the isolation provided by the DTI region 109. Therefore, less space redundancy is needed in terms of isolation between Hall sensors and other circuits. This is ideal for system-on-chip (SoC) applications.

Figures 1A, 1B:
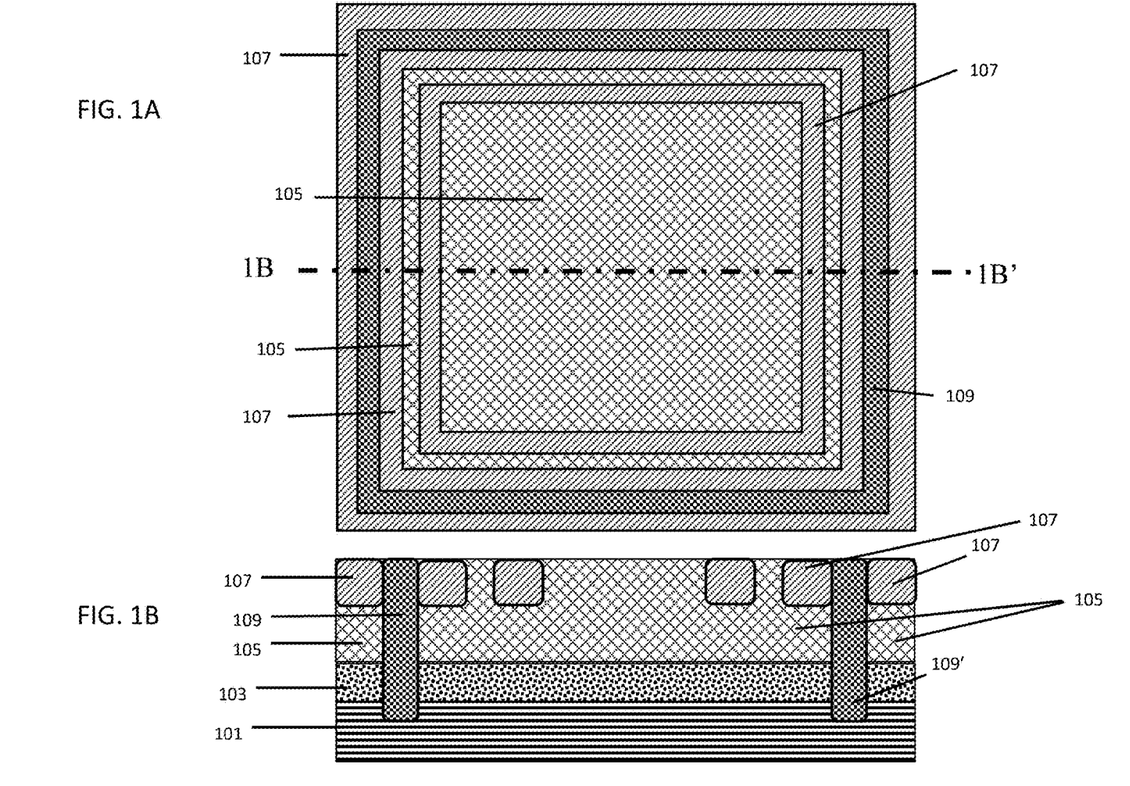
FIGS. 1A, 2A, 3A, and 4A schematically illustrate top views of a process flow to produce a 3D Hall effect sensor, in accordance with an exemplary embodiment.
FIGS. 1B, 2B, 2C, 3B, 4B and 4C schematically illustrate cross-sectional views of FIGS. 1A, 2A, 3A, and 4A, respectively, of a process flow to produce a 3D Hall effect sensor, in accordance with an exemplary embodiment.
Figures 2A, 2B, 2C:
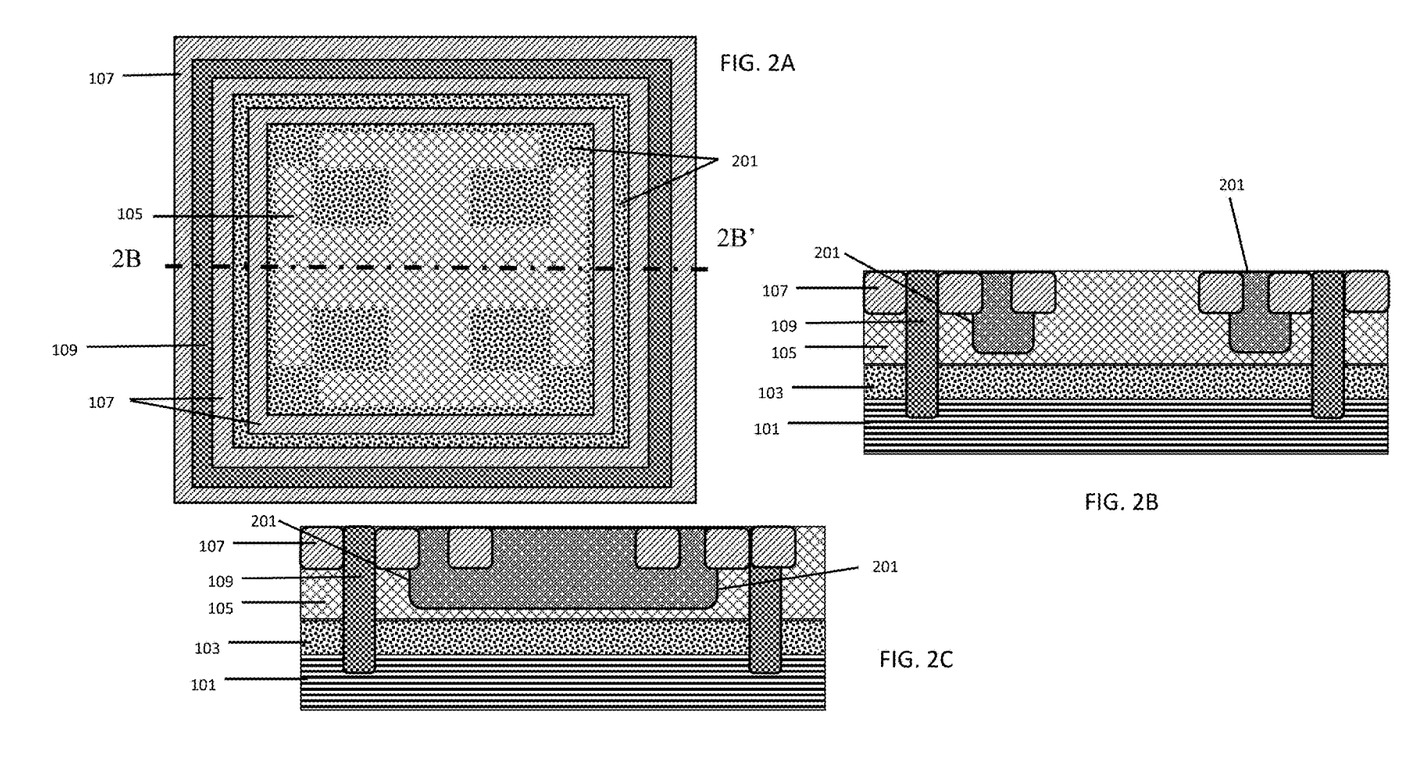

In FIGS. 2A and 2B, a p-type well 201 is formed in the n-epitaxial growth 105 of substrate 101. FIG. 2B is a cross-sectional view of FIG. 2A along line 2B-2B'. The p-type well 201 is positioned between adjacent STI regions 107 in the cross-sectional view and surrounds the n-epitaxial growth 105 in the top view of FIG. 2A. FIG. 2C shows an alternate embodiment which depicts a different p-well profile.

Figure 3A:
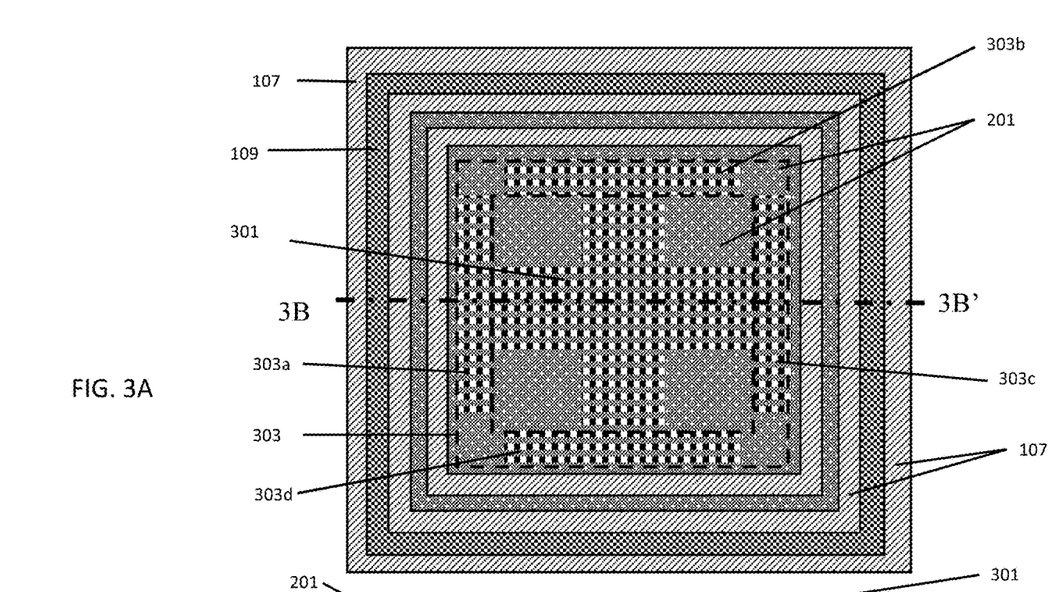
Figure 3B:
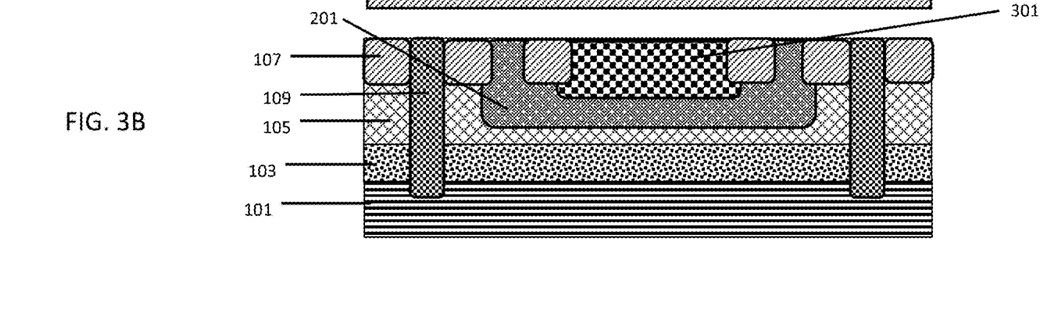

As shown in FIGS. 3A and 3B, an n-type well 301 is formed in a region surrounded by the p-type well 201 in the top view of FIG. 3A. The n-type well, referred to herein as a first n-type well 301, is formed as a cross-shaped pattern in top view, and the p-type well 201 surrounds the cross-shaped n-type well 301. In this embodiment, an additional n-type well, referred to herein as second n-type well 303, is formed and is also surrounded by the p-type well 201. The second n-type well 303 is formed as a fragmented square-shaped pattern that partially surrounds the cross-shaped n-type well 301. Each fragment of the fragmented square-shaped pattern intersects an end-point of the cross-shaped pattern perpendicularly.

The exemplary embodiment depicts the second n-type well 303 as having four fragments labeled 303a, 303b, 303c and 303d, with each fragment intersecting a respective end-point of the cross-shaped n-type well 301. The first n-type well 301 and second n-type well 303 can be formed in any order and in accordance with other pattern types. As will be discussed later, the first n-type well 301 and second n-type well 303 are the active Hall conduction regions of planar and vertical Hall elements. FIG. 3B is a cross-sectional view of FIG. 3A along line 3B-3B'. The p-type well 201 in FIG. 3B is shown extending under the first n-type well 301.

Figure 4A:
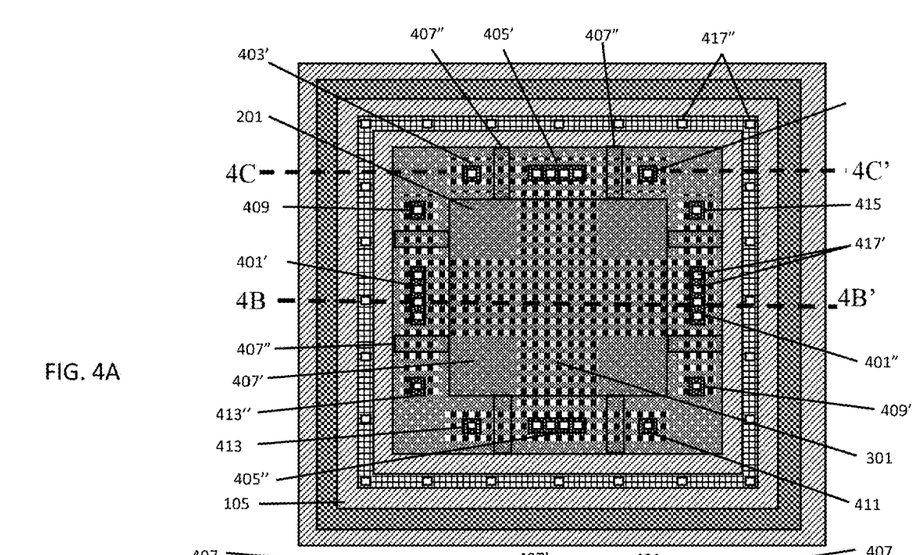

Adverting to FIG. 4A (top view), a n-type dopant 401 is implanted in the first n-type well 301. The n-type dopant 401 is implanted near the ends of the cross-shaped n-type well 301. Implants can be free from existing technology or dedicated. The n-type implanted regions form terminals 401' and 401" at the corners and terminals 405' and 405" respectively between consecutive corners. Contacts 417' can be provided on the N+ layer and above it can be metal lines for forming positive (+) and negative (−) terminals to the Hall device. Similarly, contacts 417" can be provided on the P+ layer for forming additional terminals to the Hall device while also separating the integrated vertical and planar sensing elements from circuitry configured to the 3-D Hall sensor. Dopants for the n-type well 301 include arsenic (As), phosphorous (P) and any other n-type dopants.

Figure 4B:
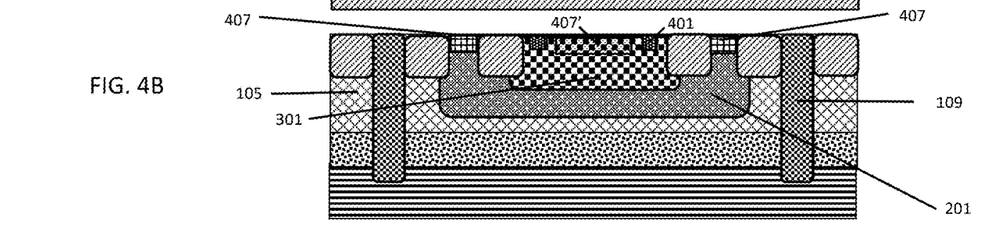
Figure 4C:
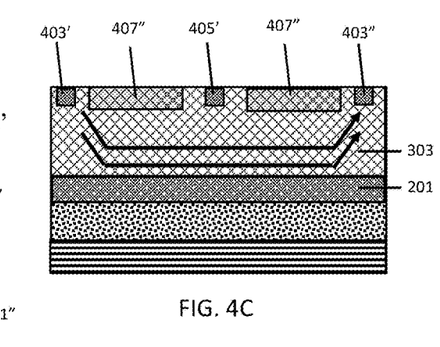

FIG. 4B is a cross-sectional view of FIG. 4A along line 4B-4B'. FIG. 4C is a cross-sectional view of FIG. 4A along line 4C-4C'. FIG. 4B represents the formation of a planar Hall element while FIG. 4C is a cross-sectional view representing formation of a vertical Hall element with voltage traveling from positive terminal 403' to negative terminal 403". The vertical Hall element corresponds to the second n-type well 303 for partially surrounding the cross-shaped first n-type well 301. The vertical Hall element is integrated within the 3-D Hall element per the same n-epitaxial growth 105.

As described, the first n-type well 301 can be formed prior to forming the p-type well 201. Alternatively, the first n-type well 301 is formed after the p-type well 201. A p-type dopant 407 can be implanted before or after the p-type well 201 and first n-type well 301, as shown in the cross-sectional (planar hall element) view of 4B. Following the formation of the p-type well 201 and first n-type well 301, an oxide based layer (not shown for illustrative convenience) is deposited and patterned to expose selected regions (e.g., all the n+, p+ regions except 407' and 407"). P-type covers 407" are formed as a cover layer over the first n-type well 301 and the second n-type well 105. The cover layer includes a p-type cover or STI region. Silicidation may be further performed to reduce contact resistance. Then an ILD (not shown for illustrative convenience) is deposited and contacts (not shown for illustrative convenience) are formed in the ILD. BEOL processing steps can be further performed.

Along line 4B-4B', 405' and 405" are complimentary Hall voltage sensing terminals for perpendicular field to line 4B-4B', while 401' and 401" are complimentary Hall voltage sensing terminals for parallel field parallel to line 4B-4B'. Hall voltage due to the sensing of a magnetic field (B) at respective planes X, Y and Z per respective terminals is as follows:

Hall Voltage Due to Bx:
  I/V bias at terminal 409' and 409
  Vx (voltage across x)=Vc (voltage at terminal 401')−Vd (voltage at terminal 401")

Hall Voltage Due to by:
  I/V bias at terminal 403' and 411
  Vy (voltage across y)=Va (voltage at terminal 405')−Vb (voltage at terminal 405")

Hall Voltage Due to Bz:
  I/V bias at terminal 401' and 401"
  Vz (voltage across z)=Va (voltage at terminal 405')−Vb (voltage at terminal 405")

I/V represents the current/voltage bias and Vx, Vy and Vz are corresponding voltages measured for a given directional magnetic field/force Bx, By and Bz applied and sensed at a respective sensing terminal. Vertical Hall sensors (Bx and By sensors) and the planar Hall sensor operate at different phases of a clock cycle to prevent interference among different elements. Alternatively, Bx and By can be activated at the same time or separately for flexibility of application of the 3-D Hall element.

Per the aforementioned approach, two n+ terminals are available within a single planar Hall element via a simple 1:1 connection scheme (not shown for illustrative convenience). This ensures simple current flow while enabling p-well pickup to reduce cross-any current interference. Still further, as the first n-type well 301 is dedicated to planar Hall sensing, tuning of the well 301 does not affect the vertical Hall devices. The planar Hall and vertical Hall elements operate separately with no interference. Moreover, cover layers 407' and 407" further support operational segregation of planar and vertical Hall elements.

Forming the 3-D Hall element in this manner enables activation of multiple Hall sensors for enhanced field sensing. For example, terminals 405' and 405" are used to detect voltage while terminals 409, 413", 415, 409', 403', 413, 403" and 411 can all be used to detect the magnetic field. Combining voltage change across 405'/405", 409/413" and 415/409' generates a better sensitivity measurement (e.g., simulation shows an ~85% sensitivity improvement due to circuit optimization).

Figure 5A:
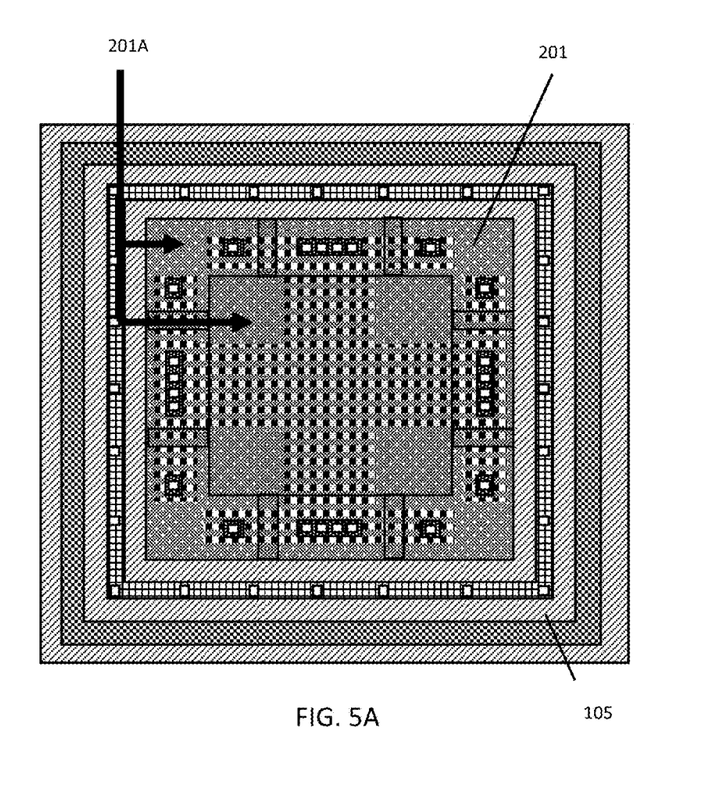
FIGS. 5A, 5B, 5C, 5D and 5E schematically illustrate top views of a 3D Hall effect sensor, in accordance with another exemplary embodiment.
Figure 5B:
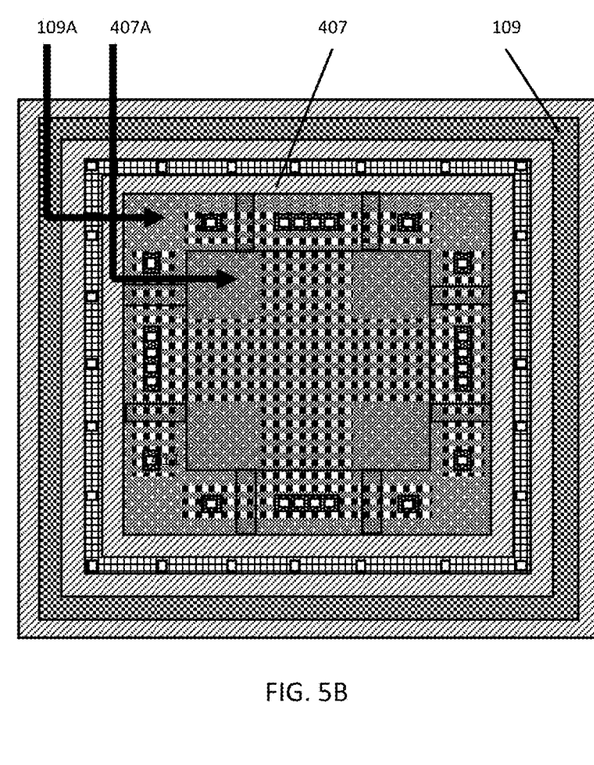

Adverting to FIGS. 5A-5E, isolation configurations of the 3D Hall element are illustrated in top view. Isolation enables variability of the sensing capability of the 3-D Hall element across multiple planes. In addition, cross-element interference is eliminated to increase sensitivity of measurement. The isolation configurations are depicted as arrowed lines for indicating certain regions of isolation of the 3-D Hall device. In FIG. 5A, the p-type well 201 provides isolation between the planar Hall element of FIG. 4B and the vertical Hall element of FIG. 4C, corresponding to isolation region 201A. In FIG. 5B, the STI 407 isolates between the planar Hall element of FIG. 4B and vertical Hall element of FIG. 4C while the DTI 109 isolates between the vertical Hall element. This corresponds to isolation configuration 109A and 407A, thus indicating separation between elements within the regions being pointed to.

Figure 5C:
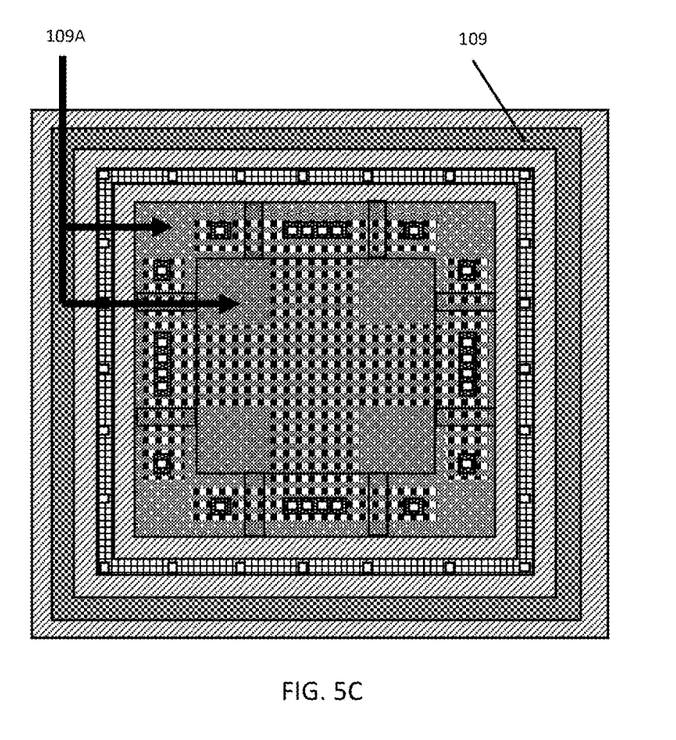
Figure 5D:
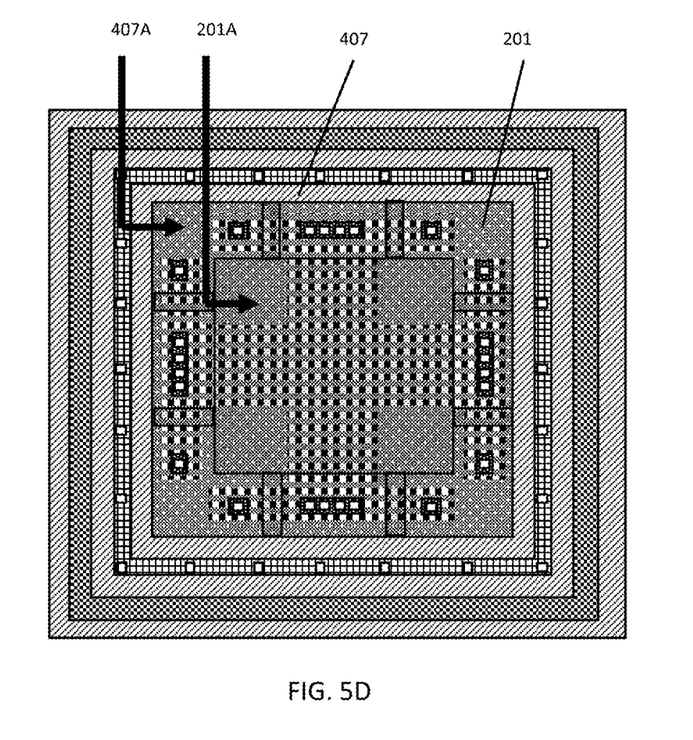
Figure 5E:
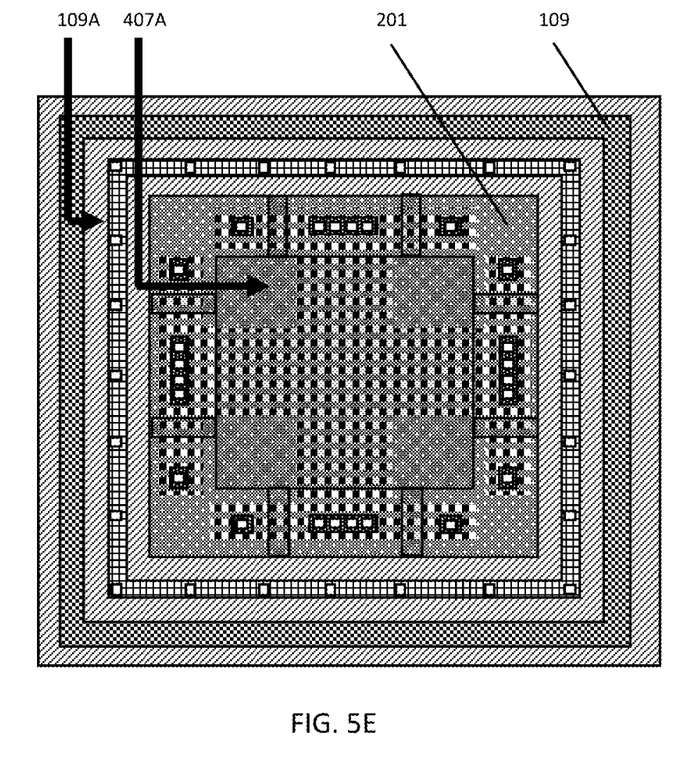

In FIG. 5C, the DTI 109 isolates between different Hall elements, corresponding to isolation configuration 109A. In FIG. 5D, the p-type well 201 isolates between the planar Hall element and vertical Hall element of FIGS. 4B and 4C respectively while the STI 407 isolates between the vertical Hall element. This corresponds to isolation configurations 407A and 201A. In FIG. 5E, the p-type well 201 isolates between the planar Hall element and vertical Hall element while the DTI 109 isolates between the vertical Hall element, corresponding to isolation configurations 109A and 407A These embodiments represent a multi-terminal sensing capability within an integrated 3D Hall element of minimal size while supporting isolated operation of respective elements and regions.

Figure 6A:
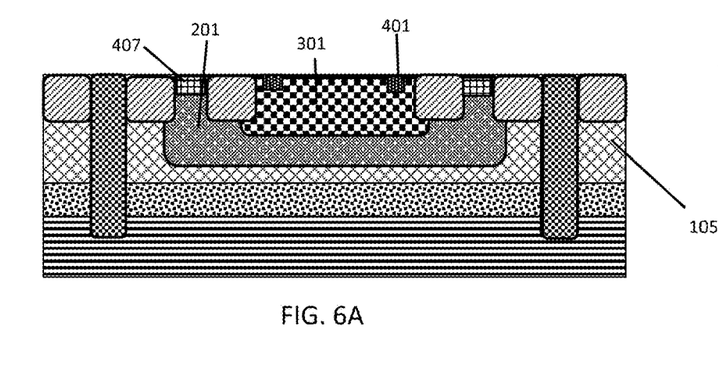
FIGS. 6A, 6B, 6C, 6D, 6E, 6F, 6G, 6H, 6I, 6J, 6K, and 6L schematically illustrate cross-sectional views of different embodiments of planar Hall element portions of the 3D Hall element.
Figure 6B:
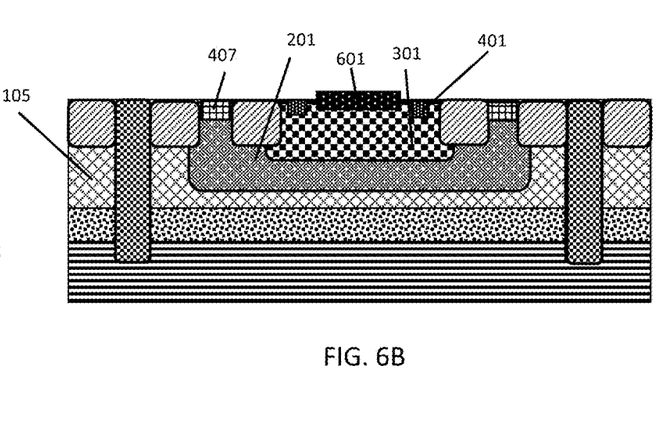
Figure 6C:
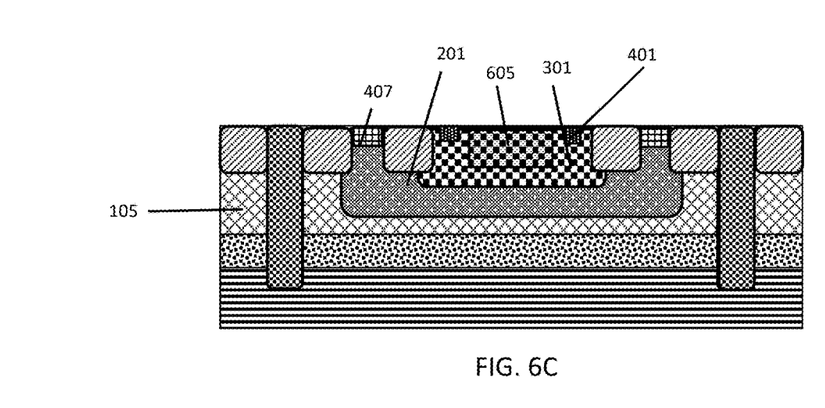
Figure 6D:
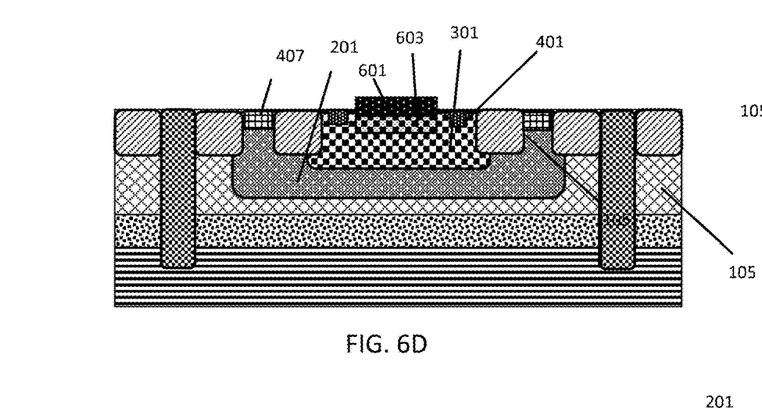
Figure 6E:
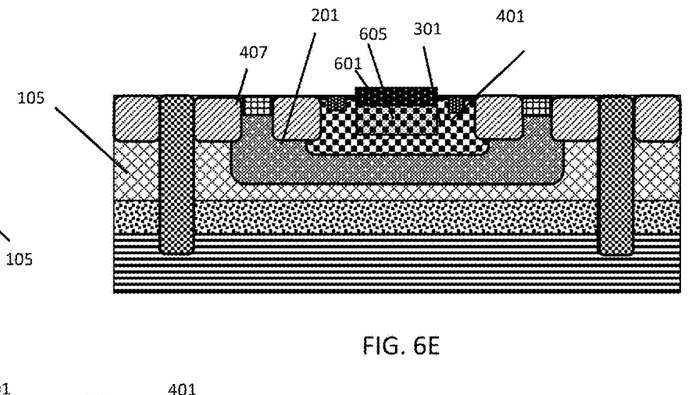
Figure 6F:
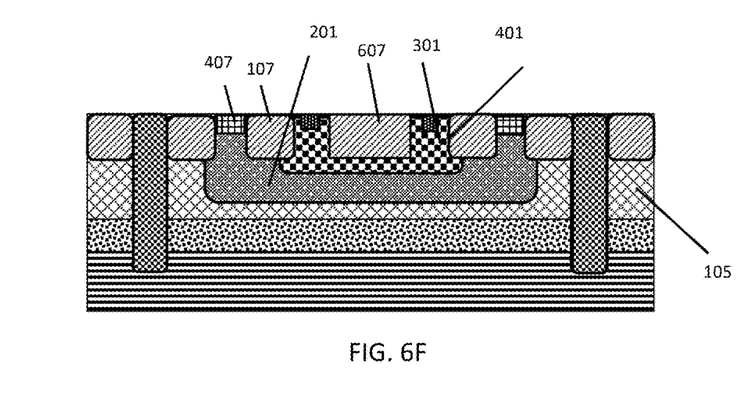
Figure 6G:
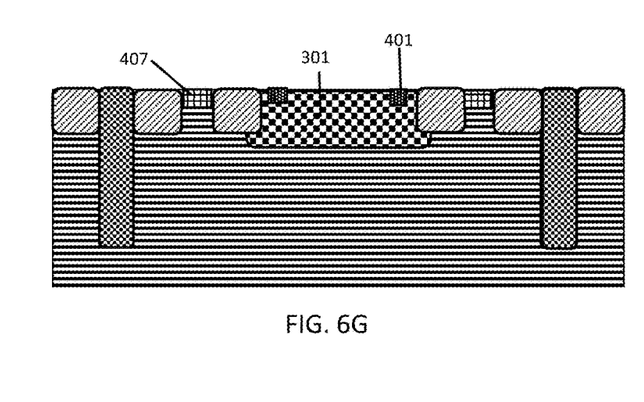
Figure 6H:
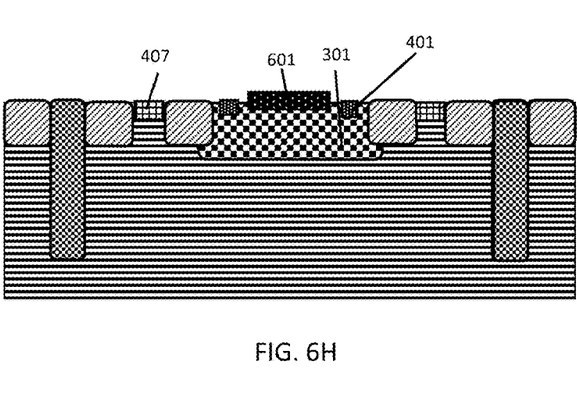
Figure 6I:
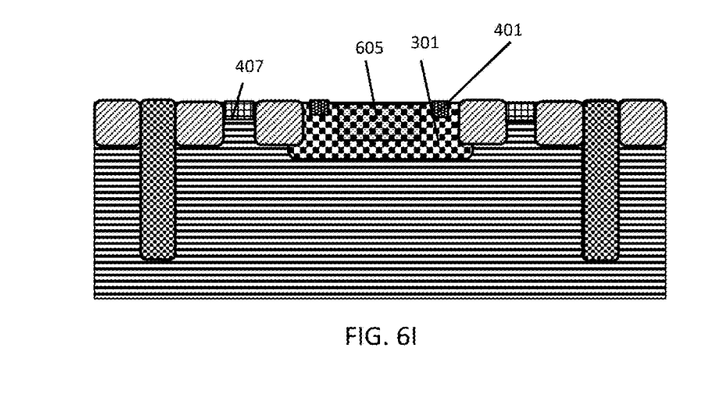
Figure 6J:
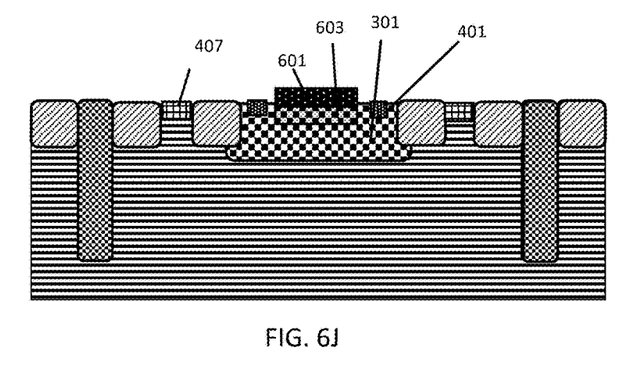
Figure 6K:
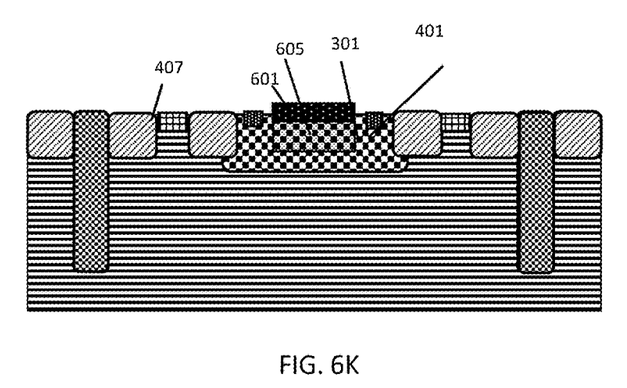
Figure 6L:
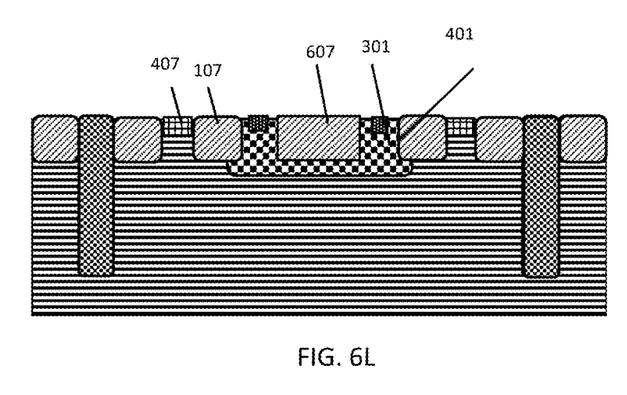

FIGS. 6A, 6B, 6C, 6D, 6E, and 6F schematically illustrate cross-sectional views of different embodiments of planar Hall element portions of the 3D Hall element that can be used in the previous embodiments. In FIG. 6A, no p-type cover 407' is provided over the n-type well 301 for the planar Hall element portion. In FIG. 6B, a LOCOS cover 601 is provided instead of a p-type cover 407'. In FIG. 6C, a thicker p-type cover 605 is provided instead of a p-type cover 407'. A cover 605 is a thicker p-type cover which results in a thinner Hall plate. In FIG. 6D, a combination of LOCOS cover 601 and p-type cover 407' is provided. In FIG. 6E, a combination of LOCOS cover 601 and thicker p-type cover 605 is provided. In FIG. 6F, a STI region 607 is provided instead of a p-type cover 407'.

FIGS. 6G, 6H, 6I, 6J, 6K and 6L resemble FIGS. 6A, 6B, 6C, 6D, 6E, and 6F, respectively, but the substrate 101 includes only a p-type substrate. As such, no additional p-type wells 201 or n-epitaxial growth 105 are required. The p-type substrate 101 directly contacts the DTI regions and n-type wells 301.

Figure 7A:
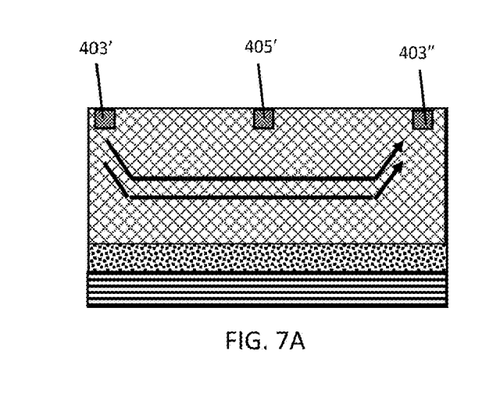
FIGS. 7A, 7B, 7C, 7D, 7E, and 7F schematically illustrate cross-sectional views of different embodiments of vertical Hall element portions of the 3D Hall element
Figure 7B:
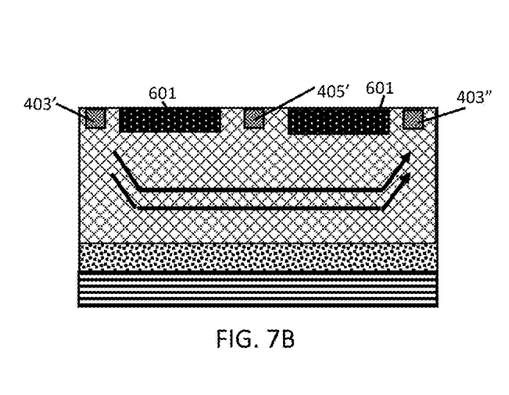
Figure 7C:
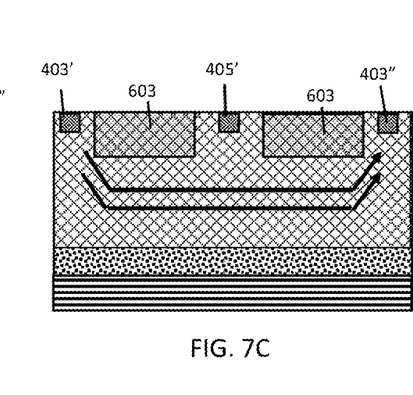
Figure 7D:
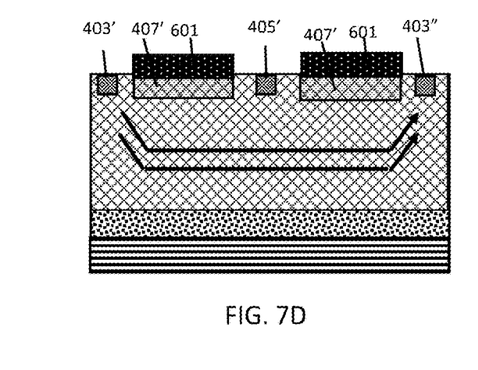
Figure 7E:
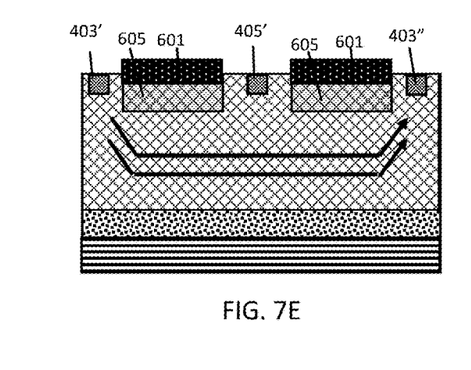
Figure 7F:
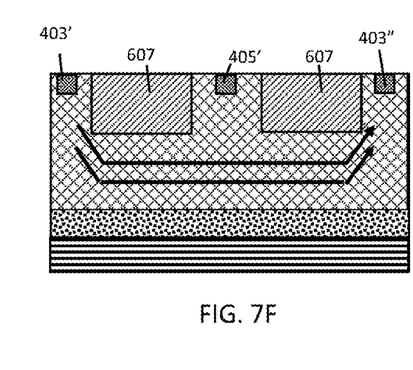

FIGS. 7A, 7B, 7C, 7D, 7E and 7F schematically illustrate cross-sectional views of different embodiments of vertical Hall element portions of the 3D Hall element that can be used in the previous embodiments using a single n-type well 301 or both n-type wells 301 and 301' as in FIG. 3A. In FIG. 7A, no p-type cover 407' is provided as it is in FIG. 4A. In FIG. 7B, LOCOS covers 601 are provided instead of a p-type cover 407'. In FIG. 7C, thicker p-type layer covers 603 are provided instead of a p-type cover 407'. In FIG. 7D, a combination of LOCOS cover 601 and p-type cover 407' is provided. In FIG. 7E, a combination of LOCOS cover 601 and thicker p-type cover 605 is provided. In FIG. 7F, STI regions 607 are provided instead of a p-type cover 407'. As with the prior embodiments, the vertical Hall element has voltage traveling from positive terminal 403' to negative terminals 403".

Per the aforementioned approach, three n+ terminals are available within a single planar Hall element. Resultantly, the sense terminal of the 3-D Hall element is located at the center, while conduction terminals are located near the left and right edge of the first and second n-type wells. Current flows contiguously along the wells—to detect magnetic fields perpendicularly.

Also, the second n-type well 105 of the vertical Hall element can be the same or different than the first n-type well 301 of the planar Hall element. Consequently, the planar Hall elements and vertical Hall elements can be separately tuned. Still further, the width of the vertical Hall elements is independent of the planar Hall element. Hence, the ability of the vertical Hall element to measure sensitivity due to a larger planar Hall element width is not reduced.

The embodiments of the present disclosure achieve several technical effects, including a Hall element with integrated planar Hall elements within a single 3-D Hall element. Another technical effect is increased sensitivity of sensing due to reduced cross-interference across elements. Another technical effect includes the individual optimization of vertical and planar Hall elements for specialized sensing applications.

Devices formed in accordance with embodiments of the present disclosure enjoy utility in various industrial applications, e.g., microprocessors, smart-phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in the manufacture of any of various types of highly integrated semiconductor devices using Hall effect sensors. The present disclosure is particularly applicable in the advanced technology nodes.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming a shallow trench isolation (STI) region and a deep trench isolation (DTI) region in a substrate;
    forming a p-type well in the substrate surrounded by the STI region in top view;
    forming a first n-type well and a second n-type well surrounded by the p-type well and DTI region in top view;
    forming n-type dopant in the first n-type well and the second n-type well; and
    forming p-type dopant in the p-type well.

2. The method according to claim 1, wherein the substrate comprises a p-type substrate.

3. The method according to claim 1, wherein the substrate further comprises a n-type substrate (n-sub) implant.

4. The method according to claim 3, wherein the substrate further comprises an n-epitaxial growth over the n-sub implant.

5. The method according to claim 4, further comprising:
forming the STI region and DTI region prior to forming the p-type well,
wherein the STI region, DTI region and p-type well provide isolation between a planar Hall element located in a first region of the n-epitaxial growth in top view, a vertical Hall element located in a second region of the n-epitaxial growth extending vertically in a device in cross section view or a combination thereof.

6. The method according to claim 5, comprising:
forming the p-type well prior to forming the first n-type well or the second n-type well.

7. The method according to claim 5, comprising:
forming the p-type well after forming the first n-type well or the second n-type well.

8. The method according to claim 1, comprising:
forming the first n-type well as a cross-shaped pattern in top view; and
forming the second n-type well as a fragmented square-shaped pattern partially surrounding the cross-shaped pattern in top view,
wherein a fragment of the fragmented square-shaped pattern intersects an end-point of the cross-shaped pattern perpendicularly.

9. The method according to claim 8, further comprising:
forming a cover layer over the first n-type well and the second n-type well,
wherein the cover layer comprises a p-type cover or STI region.

10. The method according to claim 9, further comprising:
forming a layer of local oxidation of silicon (LOCOS) over the cover layer or directly on the first n-type well and the second n-type well.

11. The method according to claim 1, comprising:
forming the p-type well to surround the second n-type well in top view.

12. The method according to claim 1, further comprising:
forming an interlayer dielectric (ILD) over the first n-type well, the second n-type well and the p-type well;
performing self-aligned silicidation to reduce resistance in the first n-type well, the second n-type well and the p-type well;
forming contacts in the ILD; and
performing back-end-of-line (BEOL) processing.

13. A device comprising:
a shallow trench isolation (STI) region and deep trench isolation (DTI) region formed in a substrate;
a p-type well formed in the substrate between the STI region in top view;
a first n-type well and a second n-type well formed in the substrate and surrounded by the p-type well and DTI region in top view;
n-type dopant implanted in the first n-type well and the second n-type well; and
p-type dopant implanted in the p-type well,
wherein the device is configured to sense a magnetic field perpendicular and in-plane direction relative to the device.

14. The device according to claim 13, wherein the substrate comprises a p-type substrate and a n-type substrate (n-sub) implant and an n-epitaxial growth formed over the n-sub implant.

15. The device according to claim 14, further comprising:
a planar Hall element located in a first region of the n-epitaxial growth in top view; and
a vertical Hall element located in a second region of the n-epitaxial growth extending vertically in the device in cross section view,
wherein the p-type well is formed to surround the second n-type well and wherein the STI region, DTI region and p-type well provide isolation between the planar Hall element and the vertical Hall element.

16. The device according to claim 15, wherein the planar Hall element and the vertical Hall element are configured to operate at different clock cycles.

17. The device according to claim 13, wherein the first n-type well is formed as a cross-shaped pattern in top view, and the second n-type well is formed as a fragmented square-shaped pattern partially surrounding the cross-shaped pattern in top view.

18. The device according to claim 17, wherein a fragment of the fragmented square-shaped pattern intersects an end-point of the cross-shaped pattern perpendicularly.

19. The device according to claim 13, further comprising:
a cover layer formed over the first n-type well and the second n-type well,
wherein the cover layer comprises a p-type cover, STI region or a layer of local oxidation of silicon (LOCOS).

20. The device according to claim 13, further comprising:
an interlayer dielectric (ILD) over the first n-type well, the second n-type well and the p-type well; and
contacts in the ILD,
wherein the device is configured for multiple terminal sensing.

* * * * *